United States Patent [19]

Frommes

[11] Patent Number: 4,694,245
[45] Date of Patent: Sep. 15, 1987

[54] VACUUM-ACTUATED TOP ACCESS TEST PROBE FIXTURE

[75] Inventor: T. Michael Frommes, Minnetonka, Minn.

[73] Assignee: Precision Drilling, Inc., Minnetonka, Minn.

[21] Appl. No.: 648,786

[22] Filed: Sep. 7, 1984

[51] Int. Cl.⁴ .............................................. G01R 1/04
[52] U.S. Cl. ............................. 324/158 F; 324/73 PC
[58] Field of Search ............ 324/158 F, 158 P, 73 PC, 324/73 AT, 725; 339/117 P

[56] References Cited

U.S. PATENT DOCUMENTS

| | | |
|---|---|---|
| 3,723,867 | 3/1973 | Canarutto . |
| 3,757,219 | 9/1973 | Aksu . |
| 3,963,986 | 6/1976 | Morton et al. .................. 324/158 P |
| 3,970,934 | 7/1976 | Aksu . |
| 3,996,517 | 12/1976 | Fergason et al. . |
| 4,061,969 | 12/1977 | Dean ................ 324/158 P |
| 4,232,928 | 11/1980 | Wickersham ..................... 324/158 P |
| 4,322,682 | 3/1982 | Schadwill . |
| 4,344,033 | 8/1982 | Stowers et al. . |
| 4,362,991 | 12/1982 | Carbine . |
| 4,379,992 | 4/1983 | Geisel . |
| 4,551,673 | 11/1985 | Barth et al. ..................... 324/73 PC |

FOREIGN PATENT DOCUMENTS

| | | | |
|---|---|---|---|
| 0062833 | 11/1982 | European Pat. Off. ........ 324/158 F |
| 2465231 | 4/1981 | France ............................. 324/158 P |
| 2538554 | 6/1984 | France ............................. 324/158 P |
| 0432701 | 12/1974 | U.S.S.R. .......................... 324/158 P |

OTHER PUBLICATIONS

"Precision Test Fixtures", Ostby and Barton Company.
"Put Us to the Test", Test Point 1, Inc.

Primary Examiner—Ernest F. Karlsen
Assistant Examiner—W. Burns
Attorney, Agent, or Firm—Merchant, Gould, Smith, Edell, Welter & Schmidt

[57] ABSTRACT

A top access test probe fixture (10) for use with a vacuum-actuated primary test fixture (12) includes a probe block (70) supported for reciprocal movement on a contact board (54) mounted on the movable top platen (28) of the primary test fixture. The probe block (70) is actuated through bellows (86) disposed between the probe block and contact board (54), which bellows are connected in fluid communication with the vaccum chamber of the primary test fixture (12) so that the top access test fixture (10) is actuated simultaneously and responsive to actuation of the primary fixture. Contacts (102) are provided on the contact board (54) for engagement with probes (104) on the primary fixture (12) and probes (100) on the probe block (70) connected by leads (106) to other probes (108) on the probe block adapted for engagement with predetermined points on the top of the circuit board under test to avoid bending and thus fatigue and breakage of wires during operation.

13 Claims, 5 Drawing Figures

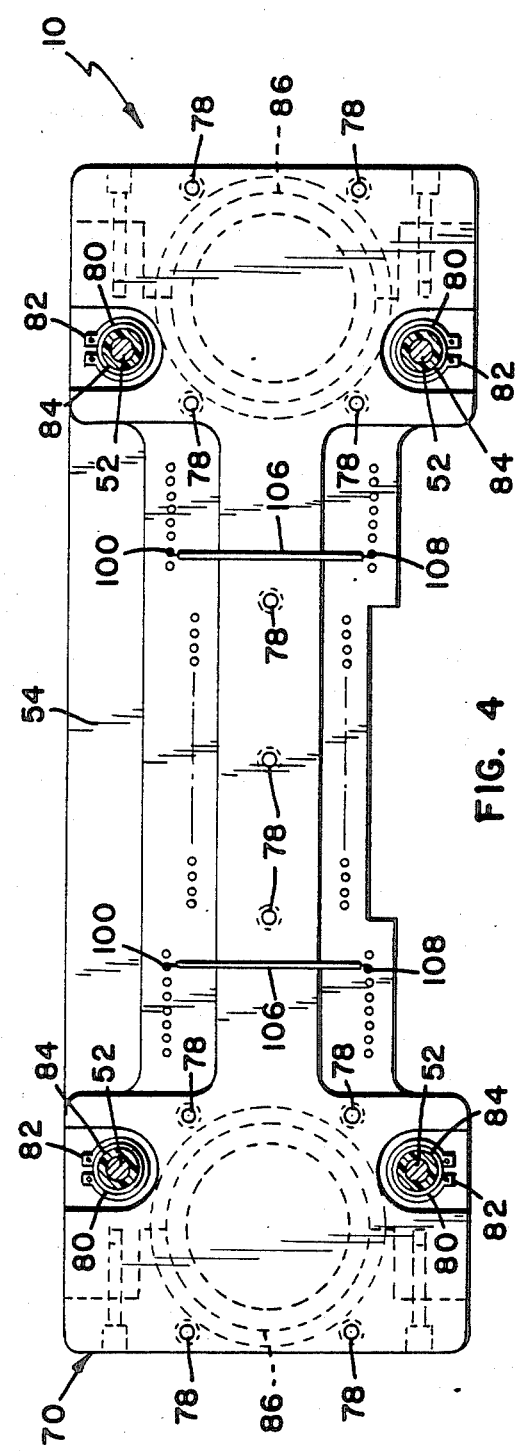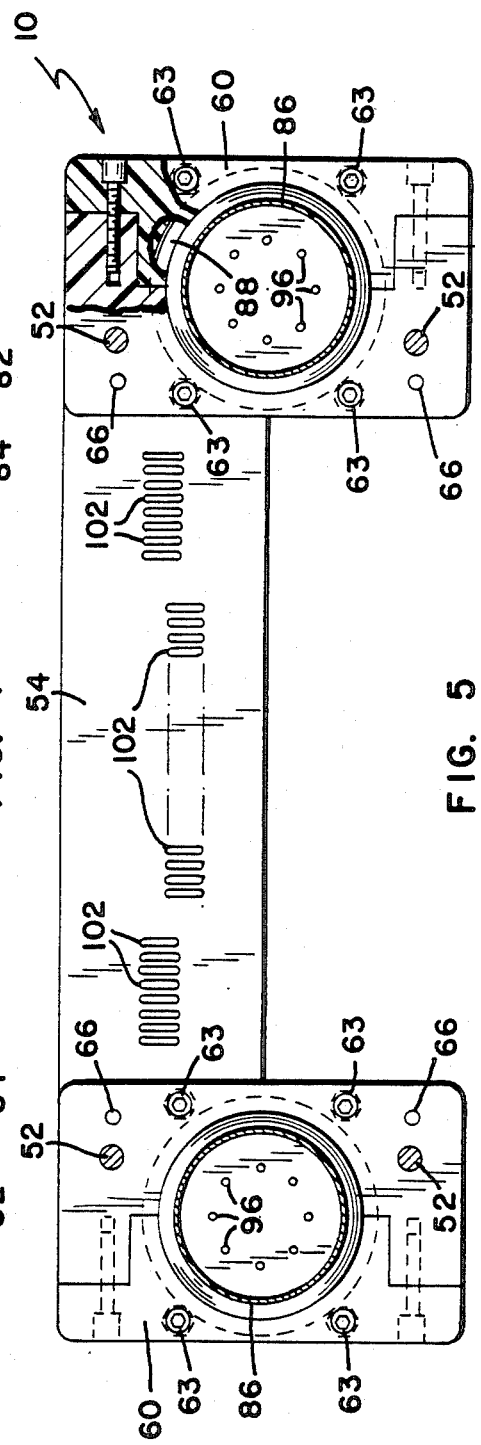
FIG. 4
FIG. 5

VACUUM-ACTUATED TOP ACCESS TEST PROBE FIXTURE

TECHNICAL FIELD

The present invention relates generally to an electrical test apparatus. More particularly, this invention involves a vacuum-actuated test fixture for automatically probing the top sides of printed circuit boards as the bottom sides of the boards are probed by a conventional primary test fixture.

BACKGROUND ART

Printed circuit boards are utilized in a wide variety of electronics applications. Such boards comprise a circuit in which the interconnecting wires have been replaced by conductive strips printed, etched, or otherwise applied to an insulative baseboard. The various components are typically located on only one side of the baseboard. Printed circuit boards are usually manufactured as subassemblies which are then tested for electrical continuity, etc., before shipment to the customer for installation.

A variety of test fixtures have been available heretofore for testing printed circuit boards. For example, the Ostby and Barton Company of Warwick, R.I., is one source of such equipment. the printed circuit board to be tested is generally mounted over an opening in a movable platen forming the top of the unit. The top platen is spring-mounted and a vacuum chamber is defined below the platen. When vacuum is applied to the chamber, the platen moves downwardly drawing the bottom side of the printed circuit board into contact with underlying test probes to effect testing of the entire board.

Both vacuum and pressure have been utilized to bias the platen and circuit board downwardly into engagement with the test probes. U.S. Pat. Nos. 4,344,033 and 3,757,219 are representative of the prior art in this particular respect. in addition, U.S. Pat. No. 3,723,867 shows a test device which incorporates an expandable bellows for moving a printed circuit board into and out of test position. Testing has been done primarily from the bottom side of the circuit board opposite that on which the components are typically located.

Not all testing probing, however, can be conducted from the bottom sides of circuit boards, and top access test probe devices have also been available heretofore for this purpose. Top test probing is relatively more difficult due to the various sizes, shapes, and positions of components, connector blocks, etc., on the component sides of circuit boards. In bottom access testing, the circuit board is typically movable relative to fixed probes, but top access testing usually requires probes movable relative to the circuit board.

Different forms of top access test fixtures have been available heretofore. For example, the integrated circuit test probe assembly shown in U.S. Pat. No. 4,362,991 utilizes a pair of side rails carrying a movable probe assembly which is adapted to access the various components on the board, regardless of their positions.

Another approach has been to use a moving probe block which is manually actuated into and out of engagement with contact fingers on the top side of the circuit board by means of toggle clamps. This approach, however, is not automatic and is rather cumbersome and not easily expandable for use with surface mounted devices.

Yet another approach has been to utilize a pinion gear and rack to pivotally actuate the probe block through an arc into and out of engagement with the top side of the circuit board. This device can be actuated automatically upon actuation of the primary test fixture, however, connection to the interface must be made through moving wires which are subject to bending stresses and thus eventual breakage. Further, this approach is best suited for probing contact fingers and has limited, if any, application to probing surface mounted devices.

Although various types of top access test probe fixtures have been available heretofore, drawbacks and disadvantages have been encountered with the prior devices. In addition to those referred to above, the prior devices are not especially compatible with emerging surface mounted device technology. Heretofore there has not been available a vacuum-actuated top access test probe fixture which is adapted for use with a vacuum-actuated primary fixture so that both sides of a printed circuit board can be probed for testing simultaneously without undue additional expanse and complication, while avoiding the breakage problems associated with bending lead wires. There is thus a need for such a test fixture.

SUMMARY OF INVENTION

The present invention comprises an improved top access test probe fixture which overcomes the foregoing and other difficulties associated with the prior art. In accordance with the invention, there is provided a test probe fixture which is adapted for use with vacuum-actuated base or primary test fixtures in order to accomplish automatic test probing of the top or component side of a circuit board simultaneously with bottom test probing of the circuit board upon actuation of the primary test fixture. The top access test probe fixture herein comprises a cover plate and a bottom contact board secured by guide rods in spaced-apart relationship. The bottom contact board is adapted for mounting on the top plate of the primary test fixture for movement therewith. Interconnected contact pads are provided on opposite sides of the contact board. A probe block is mounted for movement between the cover plate and contact board. Bellows are provided between the probe block and contact board, and the interiors of the bellows are connected in fluid communication with the vacuum chamber of the primary test fixture so that the probe block and top plate are biased downwardly simultaneously by vacuum action. At least two sets of interconnected test probes are provided on the probe block. As the probe block is actuated downwardly, one set of test probes engage the contact pads on the top side of the contact board, while the other set of test probes engage predetermined contact points on the top of the printed circuit board under test so that the circuit board is automatically test probed from both sides simultaneously.

BRIEF DESCRIPTION OF DRAWINGS

A better understanding of the invention can be had by reference to the following Detailed Description in conjunction with the accompanying Drawings, wherein:

FIG. 4 is an enlarged horizontal-sectional view taken along lines 4—4 of FIG. 1 in the direction of the arrows; and FIG. 5 is an enlarged horizontal-sectional view taken along lines 5—5 of FIG. 1 in the direction of the arrows.

DETAILED DESCRIPTION

Figure 1:
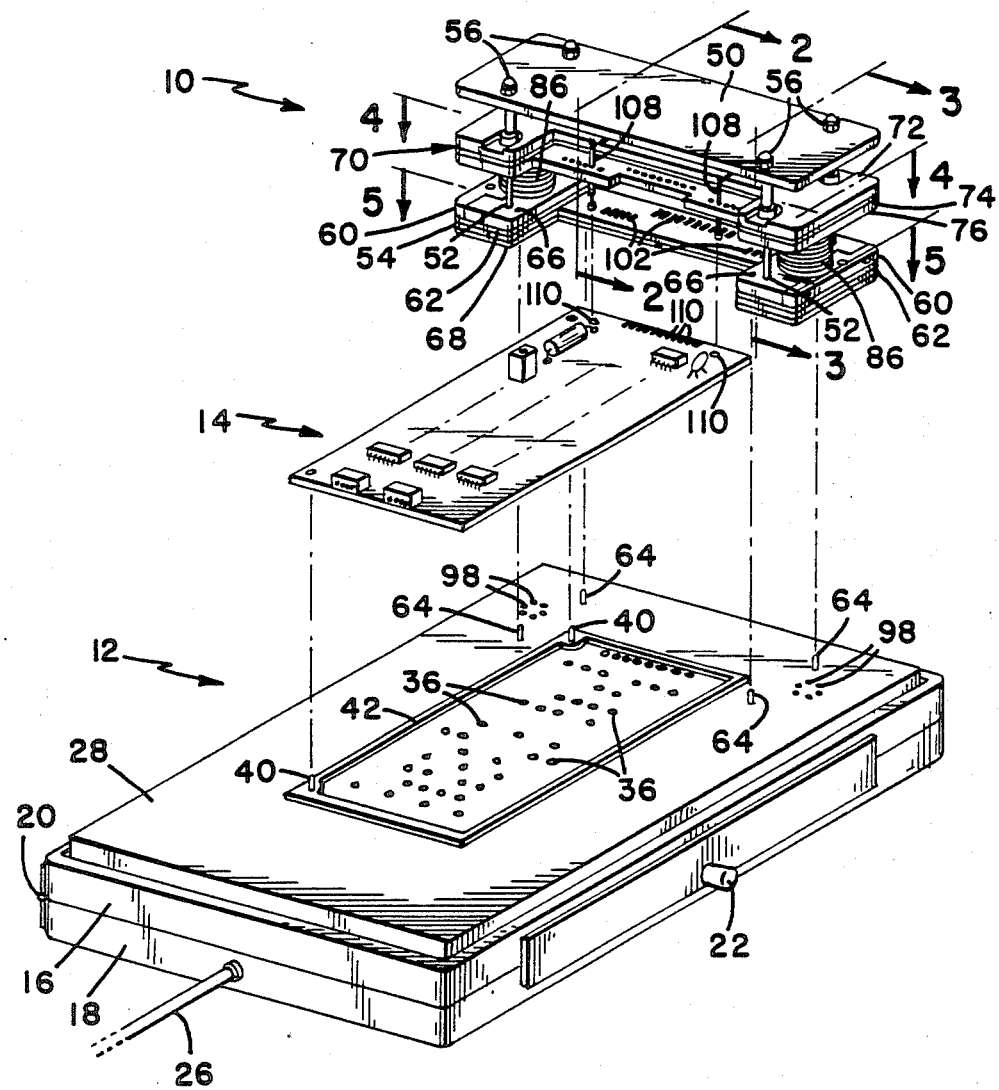
FIG. 1 is an exploded view of a primary test fixture incorporating the vacuum-actuated top access test device of the invention.

Referring now to the Drawings, wherein like reference numerals designate like or corresponding elements throughout the views, and particularly referring to Figure 1, there is shown the vacuum-actuated top access test probe fixture or apparatus 10 of the invention. As will be explained more fully hereinafter, the test probe apparatus 10 is adapted for use with a vacuum-actuated primary test fixture 12 which has been slightly modified so that both sides of a printed circuit board 14 can be probed and tested simultaneously.

Figure 2:
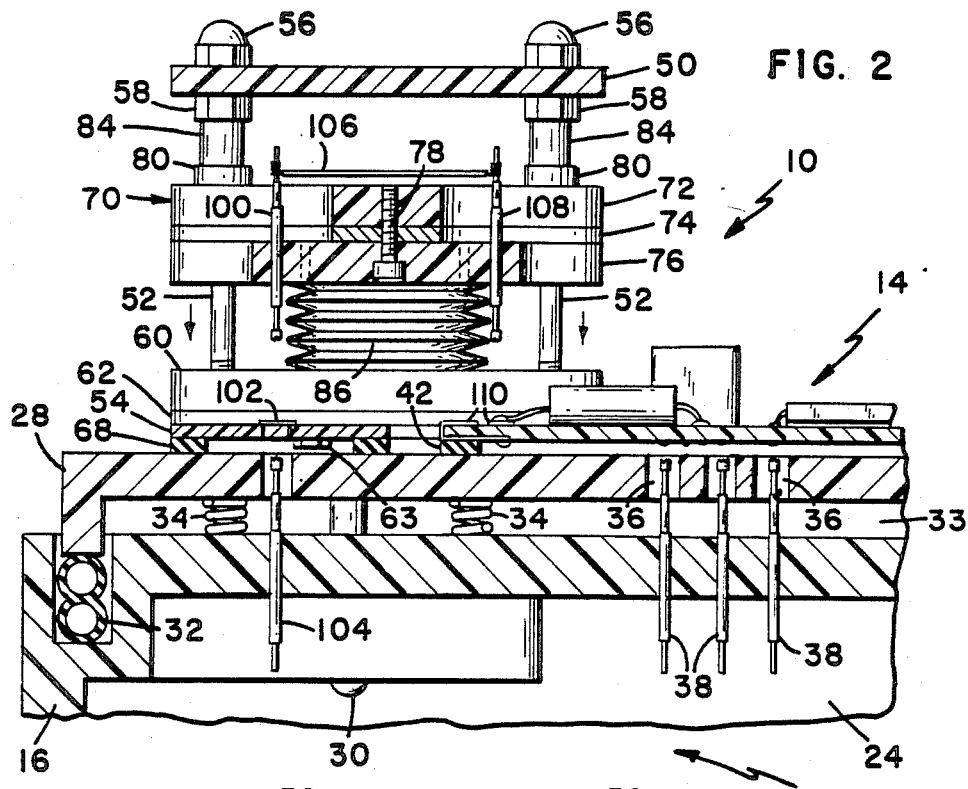
FIG. 2 is an enlarged vertical-sectional view taken along lines 2—2 of FIG. 1 in the direction of the arrows.
Figure 3:
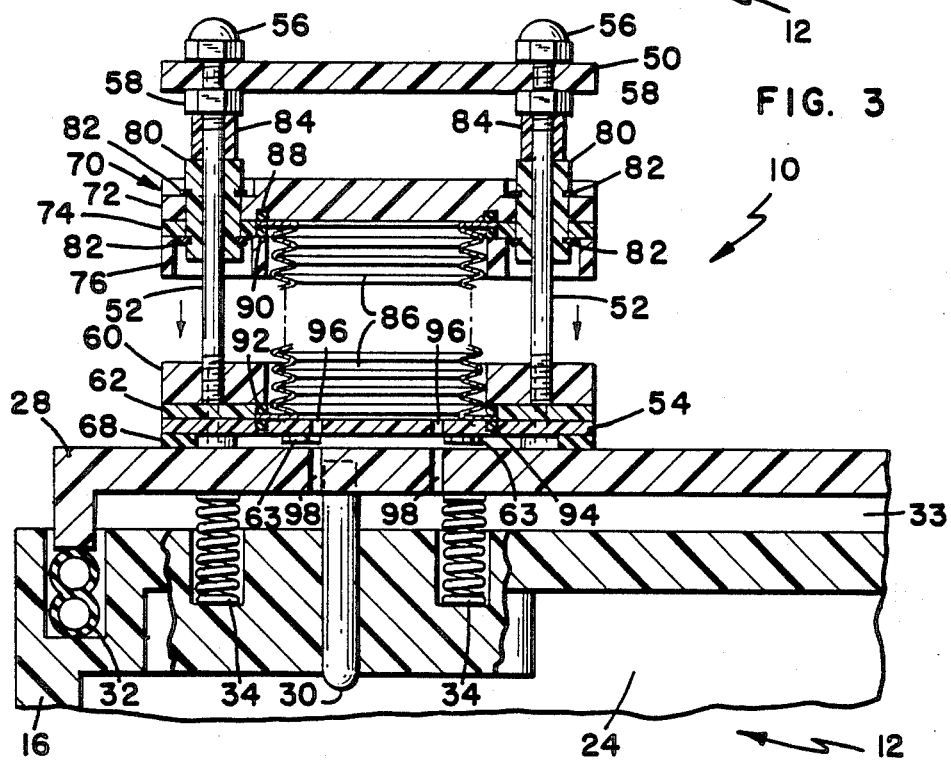
FIG. 3 is an enlarged vertical-sectional view taken along lines 3—3 of FIG. 1 in the direction of the arrows.

Referring now to FIG. 1 in conjunction with FIGS. 2 and 3, the vacuum-actuated primary test fixture 12 can be of any suitable construction. For example, as illustrated, the test fixture 12 is of the type available from Test Point 1, Inc., of San Jose, Calif., under the name Accu-Probe. The text fixture 12 comprises a bottom plate 16 and base plate 18 connected along one side by a hinge 20 and closed with a latch 22 on the other side to define an enclosure 24 housing the test interface circuitry (not shown) for the particular circuit board to be tested. A portion of enclosure 24 is selective evacuated by a conduit 26 connected to a vacuum source (not shown) for actuation to effect testing. The vacuum conduit 26 is shown extending from one side of enclosure 24, however, it can be connected to the underside or back as desired depending upon the type of test fixture 12 being utilized.

A movable platen or plate 28 is supported by guide pins 30 on the bottom plate 16 for vertical movement, as is best seen in FIG. 3. A tubular gasket 32 is provided about the peripheral flanges of the top and bottom plates 28 and 16 for purposes of sealing the space therebetween to define a vacuum chamber 33 connected to conduit 26. Compression springs 34 are provided between the top and bottom plates 28 and 16 for normally biasing the top plate upward. Access holes 36 are provided in the top plate 28 for receiving the fixed test probes 38 mounted in the bottom plate 16. The probes 38 are of the conventional plungertype, spring pin test probes available commercially.

When vacuum is applied to the chamber 33, the top plate 28 and the circuit board 14, which is mounted on locator pins 40 over a peripheral gasket 42 on the top plate, move downwardly against the springs 34 so that the test probes 38 extend through openings 36 and engage the underside of the circuit board so that testing can be accomplished. When the vacuum in chamber 33 is relieved, the top plate 28 and the circuit board 14 under test move upwardly out of engagement with the test probes 38. These are the general features and operation of a conventional vacuumactuated primary test fixture adapted for probing only the undersides of circuit boards.

The constructional details of the top access test probe fixture 10 of the invention are best shown in Figures 2 through 5. In particular, the fixture 10 includes a cover plate 50 secured by guide rods 52 in spaced-apart relationship with a bottom contact board 54. The cover plate 50 and contact board 54 extend along one side of the circuit board 14 under test. The cover plate 50 is secured on the top ends of the guide rods 52 by cap nuts 56 and jam nuts 58. Two spaced-apart, upright guide rods 52 are provided at each end of the test fixture 10.

In accordance with the preferred embodiment, each end of the contact board 54 includes two additional stacked layers 60 and 62 to facilitate threaded connection with the lower ends of the guide rods 52, and to facilitate assembly and sealing of the bellows as will be explained more fully below. The bottom contact board 54 and layers 60 and 62 are secured together by transverse connectors 6 consisting of screws and nuts.

The test device 10 is mounted on the movable top plate 28 of the vacuum-actuated test device 12 adjacent circuit board 14 by means of locator pins 64 which are adapted for receipt by corresponding pairs of holes 66 provided in the contact board 54 and also preferably in layers 60 and 62 as well. A peripheral seal 68 is disposed between the bottom contact board 54 and the movable top plate 28.

A probe block 70 is mounted for reciprocal movement along the guide rods 52 between the cover plate 50 and the contact board 54. As illustrated, the probe block 70 is of stacked multilayer construction including layers 72, 74 and 76 interconnected by transverse connectors 78. The probe block 70 is guided along the rods 52 by linear bearings 80 secured in place by spring clips 82. Spacers 84 are provided on the guide rods 52 between the probe board 70 and the cover plate 50.

A pair of bellows 86, one of which is located at each end of the test probe fixture 10, are provided between the probe block 70 and the contact board 54. The bellows 86 are of dual purpose in that they serve to normally bias the probe block 70 upward away from the circuit board 14, and also serve to transfer vacuum from the primary text fixture 12 to the probe block, thus urging it downwardly into engagement with the circuit board simultaneously upon actuation of the primary test fixture. The bellows 86 can be constructed from metal or other suitable material.

As is best seen in FIG. 3, O-rings 88 and 90 are provided between the upper flange of each bellows 86 and the probe block 70. Similarly, O-rings 92 and 94 are provided between the bottom flange of each bellows 86 and the contact board 54. The lateral outside sections of layers 60 and 72 are preferably sectioned as shown in FIGS. 4 and 5 so as to facilitate assembly and sealing of the bellows 86.

The bellows 86 are positioned over ports or holes 96 in the contact board 54 which in turn communicate through holes 98 in the bottom plate 28 to the vacuum chamber 33. Accordingly, the modifications necessary to adapt the top access text fixture 10 for use with a conventional vacuum-actuated primary test fixture include locator pins 64 and vacuum access holes 98. It will thus be appreciated that the vacuum chamber of the base fixture 12 is fluidly connected directly to the interiors of bellows 86 so that positioning of the probe block 70 is automatically responsive to vacuum-actuation of the base test fixture 12. This comprises a significant feature of the present invention. Although this is the preferred construction, however, it will be understood that other equivalent internal or external means can be utilized for connecting the vacuum chamber 33 in fluid communication with bellows 86.

When vacuum is applied to chamber 33, vacuum is also applied through bellows 86 to the probe block 70 of the top access test probe fixture 10. The probe block 70 thus moves downwardly relative to the circuit board 14 as the circuit board and the bottom plate 28 move downwardly toward the underlying fixed test probes 38.

At least two sets of top probes are provided on the probe block 70. Probes 100 on block 70 are positioned for engagement with contact 102, which are provided on opposite sides of the contact board 54 by means of plugged plated-through holes or the like and which in turn are positioned for engagement with fixed probes 104 on the bottom plate 16. Probes 104 are connected to the tester interface (not shown). As illustrated, three sets of interface contacts 102 are provided on the bottom contact board 54. Probes 100 are connected by lead wires 106 to other probes 108 on block 70 which are positioned for engagement with edge connector fingers or contacts 110, or other predetermined points on the top of the circuit board 14 under test. Probes 100, 104 and 108 are similar in construction to probes 38. The probe block 70 is thus mounted for reciprocal movement toward and away from the circuit board 14 under test responsive to vacuum actuation of the base fixture 12. Although the top access test probe fixture 10 is illustrated and described for use in probing the edge connector pins, it will be understood that the invention can be adapted for probing the contacts of certain components or other points on the top of the circuit board 14.

From the foregoing, it will thus be apparent that the present invention comprises an improved vacuum-actuated top access test probe fixture having several advantages over the prior art. One significant advantage involves the fact that all electrical contacts are made by linear action spring pin probes without bending any lead wires. Test probing of the top of the circuit board is conducted automatically and simultaneously upon probing of the underside of the board under test. The device herein provides extended test capability with only minimal modification of the primary test fixture. Other advantages will be evident to those skilled in the art.

Although particular embodiments of the invention have been illustrated in the accompanying Drawings and described in the foregoing Detailed Description, it will be understood that the invention is not limited only to the embodiments disclosed, but is intended to embrace any alternatives, equivalents, modifications and/or rearrangements of elements falling within the scope of the invention as defined by the following claims.

What is claimed is:

1. Top access test probe apparatus for use with a vacuum-actuated test fixture having a movable top platen and a vacuum chamber defined below the platen, which comprises:
   a contact board mounted adjacent to a circuit board under test on the platen of the test fixture for movement therewith;
   a plurality of pairs of electrically interconnected contact pads provided on opposite sides of said contact board;
   a probe block;
   means for supporting said probe block on said contact board for linear reciprocal movement relative to the circuit board under test;
   a plurality of pairs of electrically interconnected depending test probes mounted on said probe block for movement therewith, one test probe of each pair being positioned for engagement with a contact pad on said contact board and the other test probe of each pair being positioned for engagement with a predetermined point on the top of the circuit board under test;
   a pair of laterally spaced apart bellows sealingly engaged between said probe block and said contact board, said probe block being normally biased upwardly away from the circuit board by said bellows; and
   means extending between said bellows and said vacuum chamber for fluidly interconnecting said bellows and the vacuum chamber of the test fixture so that said probe block and said test probes thereon are vacuum-actuated downwardly into engagement with the top of the circuit board simultaneously upon acutation of the test 2. The test probe apparatus of claim 1, wherein said contact board and probe block are formed of electrically nonconductive material.

3. The test probe apparatus of claim 1, wherein said means for supporting said probe block for linear reciprocal movement, comprises:
   a cover plate positioned in spaced relationship with said contact board;
   a plurality of rods secured between said cover plate and said contact board;
   a plurality of guides secured to said probe block and constrained for movement along said rods between said cover plate and said contact board.

4. The test probe apparatus of claim 1, wherein said test probes comprise spring pins.

5. Top access test probe apparatus for use with a vacuum-actuated test fixture having a movable top platen, which comprises:
   a contact board adapted for mounting adjacent to a circuit board under test on the platen of the test fixture for movement therewith;
   a pluality of pairs of electrically interconnected contact pads provided on opposite sides of said contact board;
   a probe block;
   means for supporting said probe block on said contact board for linear reciprocal movement relative to the circuit board under test;
   a plurality of pairs of electrically interconnected test probes mounted on said probe block for movement therewith, one test probe of each pair being positioned for engagement with a contact pad on said contact board and the other test probe of each pair being positioned for engagement with a predetermined point on the top of the circuit board under test;
   at least one bellow sealingly engaged between said probe block and said contact board, said probe block being normally biased away from the circuit board by said bellows; and
   means for fluidly interconnecting said bellows and the text fixture so that said probe block and said test probes are vacuum-actuated into engagement upon actuation of the test fixture;
   wherein said means for fluidly communicating said bellows with said test fixture comprises:
   a peripheral seal disposed between said contact board and the platen of the test fixture;

said platen including openings within said peripheral seal communicating with openings opening into said bellows to provide fluid communication between said bellows and a vacuum chamber defined beneath the platen.

6. The test probe apparatus of claim 1, further including:
a plurality of locator pins secured to the platen of the test fixture and adapted for registry with corresponding holes in said contact board to locate the apparatus in predetermined relationship relative to the circuit board under test.

7. Top access test probe apparatus for use with a vacuum-actuated test fixture having a movable top platen and a vacuum chamber defined below the platen, which comprises:
a contact board mounted adjacent to a circuit board under test on the platen of the test fixture for movement therewith;
a plurality of pairs of electrically interconnected contact pads located on opposite sides of said contact board;
a cover plate positioned in spaced relationship over said contact board;
a plurality of guide rods mechanically interconnecting said cover plate and said contact board;
a probe block mounted on said guide rods for linear reciprocal movement relative to the circuit board under test;
a plurality of pairs of electrically interconnected depending test probes mounted on said probe block for movement therewith, one test probe of each pair being positioned for engagement with a contact pad on said contact board and the other test probe of each pair being positioned for engagement with a predetermined point on the top of the circuit board under test;
a pair of laterally spaced apart bellows sealingly engaged between said probe block and said contact board, said probe block being normally biased upwardly away from the circuit board by said bellows; and
means extending between said bellows and said vacuum chamber for fluidly interconnecting said bellows and the vacuum chamber of the test fixture so that said probe block and said test probes are vacuum-actuated downwardly into engagement with the top of the circuit board simultaneously upon actuation of the test fixture.

8. The test probe apparatus of claim 7, wherein said contact board and probe block are formed of electrically nonconductive material.

9. The test probe apparatus of claim 7, wherein said test probes comprise spring pins.

10. Top access test probe apparatus for use with a vacuum-actuated test fixture having a movable top platen, which comprises:
a contact board mounted adjacent to a circuit board under test on the platen of the test fixture for movement therewith;
a plurality of pairs of electrically interconnected contact pads located on opposite sides of said contact board;
a cover plate positioned in spaced relationship with said contact board;
a plurality of guide rods mechanically interconnecting said cover plate and said contact board;
a probe block mounted on said guide rods for linear reciprocal movement relative to the circuit board under test;
a plurality of pairs of electrically interconnected test probes mounted on said probe block for movement therewith, one test probe of each pair being positioned for engagement with a contact pad on said contact board and the other test probe of each pair being positioned for engagement with a predetermined point on the top of the circuit board under test;
at least one bellows sealingly engaged between said probe block and said contact board, said probe block being normally biased away from the circuit board by said bellows; and
means for fluidly interconnecting said bellows and the text fixture so that said probe block and said test probes are vacuum-actuated into engagement upon actuation of the test fixture;
wherein said means for fluidly communicating said bellows with said test fixture comprises:
a peripheral seal disposed between said contact board and the platen of the test fixture;
said platen including openings within said peripheral seal communicating with openings opening into said bellows to provide fluid communication between said bellows and a vacuum chamber defined beneath the platen.

11. The test probe apparatus of claim 7, further including:
a plurality of locator pins secured to the platen of the test fixture and adapted for registry with corresponding holes in said contact board to locate the apparatus in predetermined relationship relative to the circuit board under test.

12. The test probe apparatus of claim 7, further including:
spacers mounted on said guide rods between said probe block and said cover plate.

13. Top access test probe apparatus, which comprises:
a contact board mounted adjacent to a circuit board under test on a movable platen of a test fixture for movement therewith;
a plurality of pairs of electrically interconnected contact pads located on opposite sides of said contact board;
a cover plate positioned in spaced relationship with said contact board;
a plurality of guide rods mechanically interconnecting said cover plate and said contact board;
a probe block mounted on said guide rods for linear reciprocal movement relative to the circuit board under test;
a plurality of first test probes mounted on said probe block for movement therewith and positioned for engagement with said contact pads on said contact board;
a plurality of second test probes mounted on said probe block for movement therewith and positioned for engagement with predetermined points on the top of the circuit board under test;
a plurality of lead wires electrically interconnecting corresponding pairs of said first and second test probes;
a pair of bellows sealingly engaged between said probe block and said contact board, said probe block being normally biased away from the circuit board by said bellows; and
means including a seal and openings extending through said contact board and the platen for fluidly interconnecting said bellows and the test fixture so that said probe block and said test probes are vacuum-actuated into engagement simultaneously upon actuation of the test fixture.

* * * * *